US008338249B2

(12) United States Patent
Takahashi et al.

(10) Patent No.: US 8,338,249 B2

(45) Date of Patent: Dec. 25, 2012

(54) SEMICONDUCTOR DEVICE AND METHOD FOR MANUFACTURING THE SAME HAVING IMPROVED POLARIZATION REVERSAL CHARACTERISTIC

(75) Inventors: Makoto Takahashi, Kawasaki (JP); Mitsushi Fujiki, Kawasaki (JP); Kenkichi Suezawa, Kawasaki (JP); Wensheng Wang, Kawasaki (JP); Ko Nakamura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/031,960

(22) Filed: Feb. 15, 2008

(65) Prior Publication Data

US 2010/0207178 A1 Aug. 19, 2010

(51) Int. Cl.
*H01L 21/8234* (2006.01)

(52) U.S. Cl. .................... 438/238; 438/3; 257/E21.091; 257/E21.169; 257/E21.462

(58) Field of Classification Search .............. 438/3, 238; 257/E21.091, E21.169, E21.462
See application file for complete search history.

(56) References Cited

U.S. PATENT DOCUMENTS 6,287,986 B1 9/2001 Mihara
6,342,712 B1 * 1/2002 Miki et al. .................... 257/295
6,548,342 B1 * 4/2003 Suzuki et al. ................. 438/240
6,599,757 B1 * 7/2003 Murai ............................... 438/3
6,964,873 B2 11/2005 Matsuura et al.
2004/0113189 A1 6/2004 Takamatsu et al.

FOREIGN PATENT DOCUMENTS

| | | | |
|---|---|---|---|
| JP | 03-019373 | A | 1/1991 |
| JP | 11-343569 | A | 12/1999 |
| JP | 2000-277705 | A | 10/2000 |
| JP | 2001-126955 | A | 5/2001 |
| JP | 2002-094032 | | 3/2002 |
| JP | 2002-246564 | A | 8/2002 |
| JP | 2004-153019 | A | 5/2004 |

OTHER PUBLICATIONS

Office Action from JP Application No. 2007-040321 dated May 15, 2012.

* cited by examiner

*Primary Examiner* — David Vu
*Assistant Examiner* — Caleb Henry
(74) *Attorney, Agent, or Firm* — Arent Fox LLP

(57) ABSTRACT

A method for manufacturing a semiconductor device comprises: forming a lower electrode on a semiconductor substrate, sputtering a ferroelectric film on the lower electrode using a target, thermal treating the ferroelectric film in an atmosphere containing oxygen in accordance with an accumulated period of use of the target for fabricating the ferroelectric film, and forming an upper electrode on the ferroelectric film.

12 Claims, 11 Drawing Sheets

132
131
121
120
111
110
130
135b
124b
136b
118
116
112
135a
$T_2$
114
136a
124a
$T_1$
128a
127
126a
125

132
131
121
120
111
110
112
135b
136b
132b
124b
118
114
130
135a
136a
132a
124a
118
114
135b
136b
132b
118
124b
130
128a
127
126a
125
111

SEMICONDUCTOR DEVICE AND METHOD FOR MANUFACTURING THE SAME HAVING IMPROVED POLARIZATION REVERSAL CHARACTERISTIC

CROSS-REFERENCE TO RELATED APPLICATION

This application claims the benefit of priority from Japanese Patent Application No. 2007-040321 filed on Feb. 21, 2007, the entire contents of which are incorporated herein by reference.

BACKGROUND OF THE INVENTION

1. Field of the Invention

This application is related to a semiconductor device having a ferroelectric capacitor and a method for manufacturing the same.

2. Description of Related Art

In recent years, ferroelectric random access memory (FeRAM) provided with a ferroelectric capacitor which stores information by utilizing a hysteresis characteristic of a ferroelectric substance has been developed. The FeRAM is a nonvolatile memory in which the stored information does not disappear even when the power is turned off and has excellent characteristics such that high degree of integration, high-speed drive, high durability and low electric power consumption can be realized.

For example, the formation of a PZT film which is a material of a ferroelectric film configuring a ferroelectric capacitor is formed by a sputtering method which is described in Japanese Laid-open Patent Application Publication No. 11-343569.

Further, the related art is described in Japanese Laid-open Patent Application Publications No. 03-019373, No. 2001-126955, No. 2002-246564 and No. 2004-153019, and Japanese Patent No. 3663575.

SUMMARY

According to a certain aspect of the embodiments of the present invention, a method for manufacturing a semiconductor device comprises: forming a lower electrode on a semiconductor substrate, sputtering a ferroelectric film on the lower electrode using a target, thermal treating the ferroelectric film in an atmosphere containing oxygen in accordance with an accumulated period of use of the target for fabricating the ferroelectric film, and forming an upper electrode on the ferroelectric film.

Additional advantages and novel features of the invention will be set forth in part in the description that follows, and in part will become more apparent to those skilled in the art upon examination of the following or upon learning by practice of the invention.

DESCRIPTION OF THE PREFERRED EMBODIMENTS

Ferroelectric oxides with a large residual polarization amount and a perovskite crystal structure, for example, PZT ($Pb(Zr,Ti)O_3$) and SBT ($SrBi_2Ta_2O_9$) are principally used as a material of a ferroelectric film configuring a ferroelectric capacitor. The residual polarization amount of these ferroelectric oxide is from about 10 to 30 $\mu C/cm^2$.

A sputtering method is one example of the method of generating a PZT film. The sputtering method is one kind of a PVD (physical vapor deposition) method. DC (direct current) or RF (radio frequency) bias voltage is applied to a PZT target, thereby making an ion collide with the target. The ion collision makes PZT particles to fly out from the target and accumulate on a wafer to form a PZT film. The time at which the PZT target reduces with the growth of the PZT film and becomes no longer useful as a target (usually, a time until the target disappears) is referred to as “lifetime”.

In the formation of a PZT film by a sputtering method, a Pb concentration of the PZT film varies in accordance with the period for using the PZT target. For that reason, the Pb concentration in the PZT film is kept constant by adjusting equipment parameters, for example, a flow rate (chamber pressure) of Ar (argon) in accordance with the period for using the PZT target.

However, it has become clear that even when the flow rate of Ar (chamber pressure) is adjusted in accordance with the period for using the target, a polarization reversal characteristic of a ferroelectric capacitor (ferroelectric film) varies between the initial stage and the latter stage of the lifetime of the PZT target.

Then, reasons why the polarization reversal characteristic of the ferroelectric film varies in accordance with the period for using the target are described.

Figure 1A:
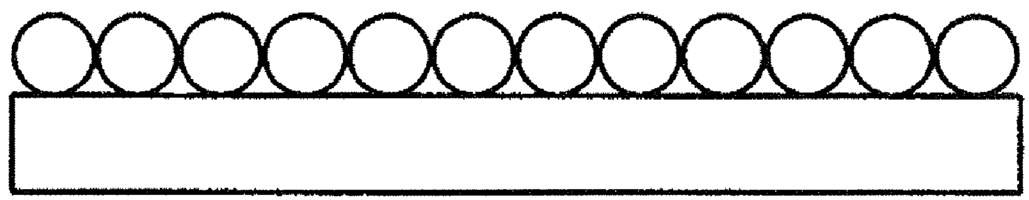
FIG. 1A shows a PZT film on a wafer.
Figure 1B:
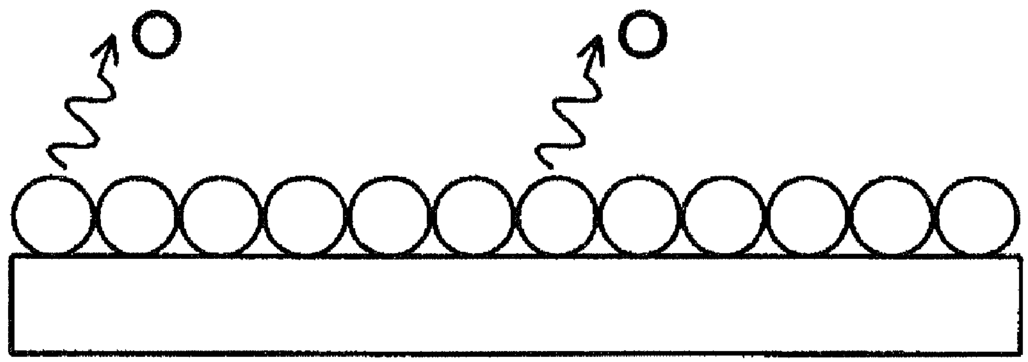
FIG. 1B shows a PZT film on a wafer.

Reasons why the polarization reversal characteristic of the ferroelectric film varies in accordance with the period for using the target can be thought as follows. That is, in the case of forming a PZT film by a sputtering method, equipment parameters, for example, a flow rate of Ar (chamber pressure) are adjusted in accordance with the period for using the PZT target. In the initial stage of the lifetime of the target, the flow rate of Ar is set up high, and a PZT film having an appropriate composition is formed on a wafer as shown in FIG. 1A. On the other hand, in the latter stage of the lifetime of the target, in order to adapt the composition, fabrication is performed by setting up the flow rate of Ar low. By setting up the flow rate of Ar low, a chamber pressure is reduced, and a bias power becomes high. For that reason, PbO in PZT is decomposed by ions with high energy, and a PZT film which is deficient in oxygen (O) is formed as shown in FIG. 1B.

After forming a ferroelectric film, a step of performing a thermal treatment (RTA: rapid thermal annealing) in an oxygen atmosphere (oxygen-feed annealing step) is carried out. However, the oxygen feed amount during the thermal treatment is kept constant. For that reason, in the case where the oxygen concentration in the ferroelectric film is scattered, the oxygen concentration in the ferroelectric film cannot be made constant even after the thermal treatment, and scattering occurs in the polarization reversal characteristic of the ferroelectric film. That is, when a ferroelectric film is formed by a sputtering method, equipment parameters, for example, a flow rate of Ar (chamber pressure), and the like are adjusted in accordance with the accumulated period for using the target. Such adjustment makes a change of the composition of the ferroelectric film as small as possible. However, when the accumulated period for using the target is longer, the oxygen concentration in the ferroelectric film is deficient. For this reason, it is thought that the polarization reversal characteristic of the ferroelectric film (ferroelectric capacitor) is deteriorated.

During the thermal treatment, the oxygen concentration in the atmosphere is varied in accordance with the period (the accumulated period) for using the target. By thus varying the oxygen concentration in the atmosphere, the oxygen concentration in the ferroelectric film after the thermal treatment is made uniform regardless of period for using the target, thereby suppressing the scattering in the polarization reversal characteristic of the ferroelectric film. For this reason, it is possible to provide a semiconductor device having a ferroelectric capacitor with a good and uniform polarization reversal characteristic and a method for producing the same. Since a good polarization reversal characteristic is obtained in a ferroelectric capacitor formed in the initial stage of the lifetime, it is also possible to exchange the target within a short period of use.

Figure 2:
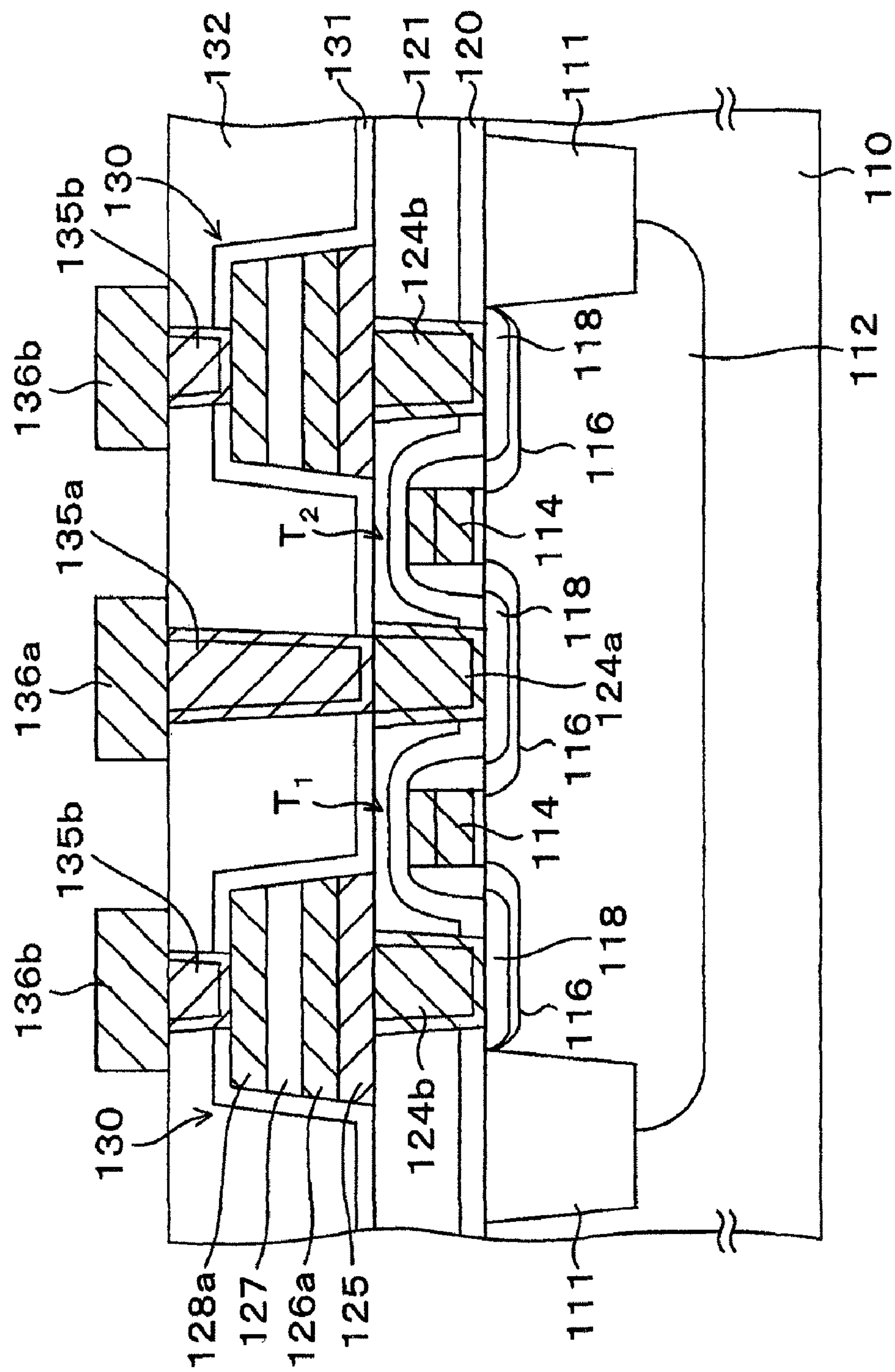
FIG. 2 shows a first embodiment of the present invention.

FIG. 2 shows a first embodiment. A device isolation layer 111 for isolating each device region is provided in an upper part of a semiconductor substrate 110. A p-well 112 or an n-well (not illustrated) is provided in each of the device regions isolated by the device isolation layer 111. In a memory cell region, two transistors $T_1$ and $T_2$ per the p-well 112 are formed as shown in FIG. 2. That is, two gate electrodes 114 are formed parallel to each other on the p-well 112 of the memory cell region. A low-concentration n-type impurity region 116 and a high-concentration n-type impurity region 118, which form the source/drain of the transistors $T_1$ and $T_2$, respectively are formed in the vicinity of the surface of the p-well 112 on both sides of the gate electrodes 114.

A stopper layer 120 is formed on the semiconductor substrate 110 so as to cover the gate electrodes 114. A first interlayer dielectric film 121 is formed on the stopper layer 120. Plugs 124*a* and 124*b*, each of which penetrates through the stopper layer 120 and is electrically connected to the n-type impurity region 118, are formed in this first interlayer dielectric film 121. The plug 124*a* is connected to the n-type impurity region 118 provided between the two gate electrodes 114. The plug 124*b* is connected to the n-type impurity region 118 provided between the gate electrode 114 and the device isolation layer 111. An upper surface of each of the interlayer dielectric film 121 and the plugs 124*a* and 124*b* is flattened by CMP (chemical mechanical polishing).

A ferroelectric capacitor 130 is formed on the plug 124*b*. This ferroelectric capacitor 130 is formed by stacking a barrier metal 125, a lower electrode 126*a*, a ferroelectric film (PZT film) 127 and an upper electrode 128*a* in this order from the lower side. The lower electrode 126*a* of the ferroelectric capacitor 130 is electrically connected to the plug 124*b* via the barrier metal 125. The ferroelectric film 127 is formed with a thermal treatment (oxygen-feed annealing) in an atmosphere with an oxygen feed amount in accordance with the period for using the target after the fabrication as described below.

A passivation film 131 is formed on the first interlayer dielectric film 121 and the ferroelectric capacitor 130. A second interlayer dielectric film 132 is formed on this passivation film 131. A plug 135*a* connected to the plug 124*a* and a plug 135*b* connected to the upper electrode 128*a* of the capacitor 130 are formed in the second interlayer dielectric film 132. A wiring 136*a* connected to the plug 135*a* and a wiring 136*b* connected to the plug 135*b* are formed on the second interlayer dielectric film 132.

In the semiconductor device (FeRAM) of the first embodiment having such a structure, the gate electrodes 114 of the transistors $T_1$ and $T_2$ in the memory cell region configure a part of a word line. The wiring 136*a* electrically connected to the high-concentration n-type impurity region 118 which is common in the transistors $T_1$ and $T_2$, configures a part of a bit line.

Figure 3:
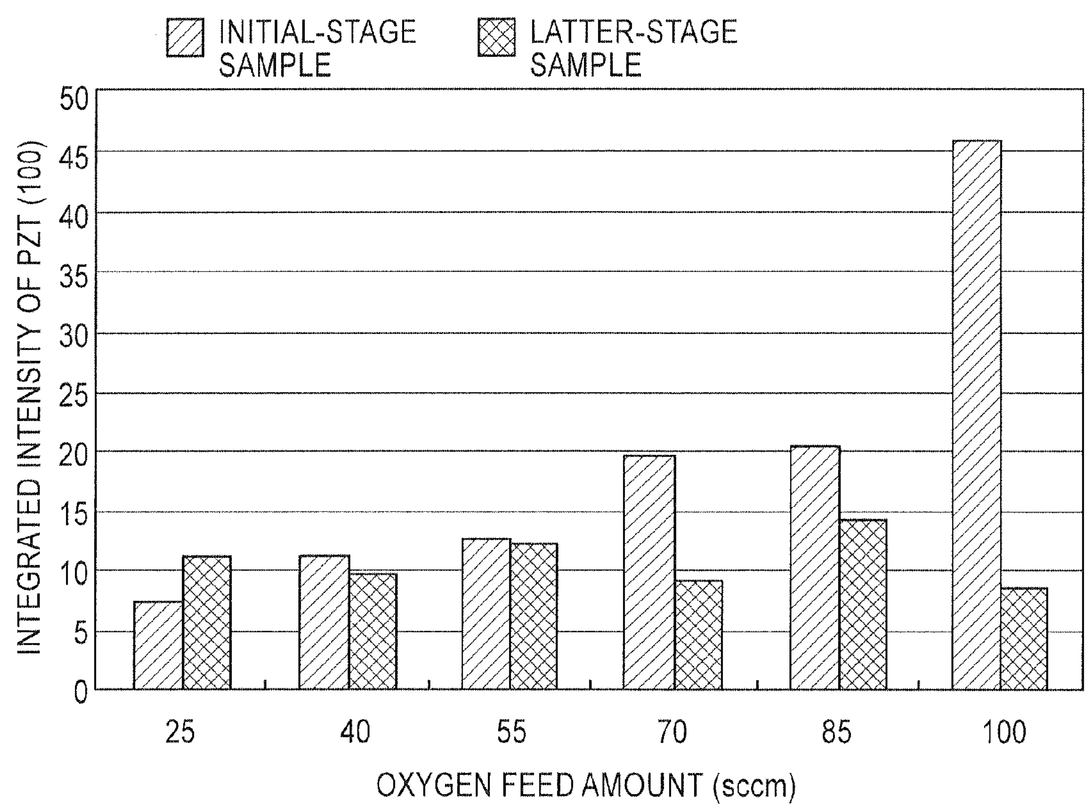
FIG. 3 shows the relationship between an oxygen feed amount at the thermal treatment and an integrated intensity of PZT (100).
Figure 4:
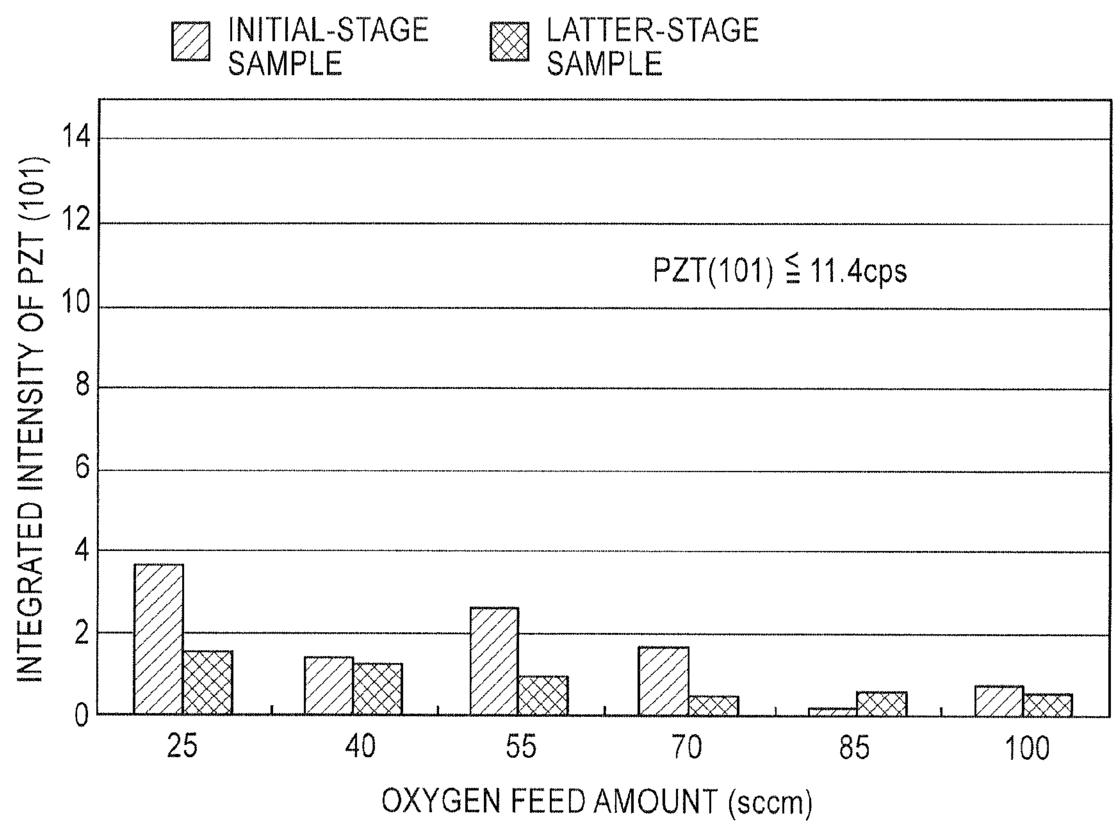
FIG. 4 shows the relationship between an oxygen feed amount at the thermal treatment and an integrated intensity of PZT (101).

A graph as shown in FIG. 3 shows the relationship between an oxygen feed amount during the thermal treatment after the formation of a PZT film and an integrated intensity of PZT (100). The abscissa represents an oxygen feed amount at the thermal treatment after the formation of a PZT film; and the ordinate represents an integrated intensity of PZT (100). FIG. 4 shows the relationship between an oxygen feed amount during the thermal treatment after the formation of a PZT film and an integrated intensity of PZT (101).

The abscissa represents an oxygen feed amount during the thermal treatment after the formation of a PZT film; and the ordinate represents an integrated intensity of PZT (101). In FIGS. 3 and 4, the “initial-stage sample” means a PZT film fabricated in the initial stage of the lifetime of a PZT target (at the period for using about 20% of a prescribed target life); and the “latter-stage sample” means a PZT film fabricated in the latter stage of the lifetime of a PZT target (at the period for using about 90% of a prescribed target life).

As shown FIGS. 3 and 4, in the PZT film fabricated in the initial stage of the lifetime of a PZT target (initial-stage sample), when the oxygen feed amount during the thermal treatment increases, the integrated intensity of PZT (101) tends to be reduced a little. However, the integrated intensity of PZT (100) increases, and the total amount of components which do not contribute to the polarization of a ferroelectric film (total amount of (100) and (101)) increases. Accordingly, it is understood that in the PZT film fabricated in the initial stage of the lifetime of a target, in order to suppress an increase of the total amount of components which do not contribute to the polarization of a ferroelectric film, it is preferred to set up the oxygen feed amount during the thermal treatment (oxygen-feeding annealing) at not more than about 55 sccm (standard cc/min).

On the other hand, in the PZT film fabricated in the latter stage of the lifetime of a PZT target (latter-stage sample), even when the oxygen feed amount after the thermal treatment increases, the integrated intensity of PZT (100) does not change so much. However, in the case where the oxygen feed amount is low, the integrated intensity of PZT (101) becomes large, and the total amount of components which do not contribute to the polarization of a ferroelectric film (total amount of (100) and (101)) increases. Accordingly, it is understood that in the PZT film fabricated in the latter stage of the lifetime of a target, it is preferred to set up the oxygen feed amount during the thermal treatment (oxygen-feed annealing) at about 70 sccm or more.

Figure 5:
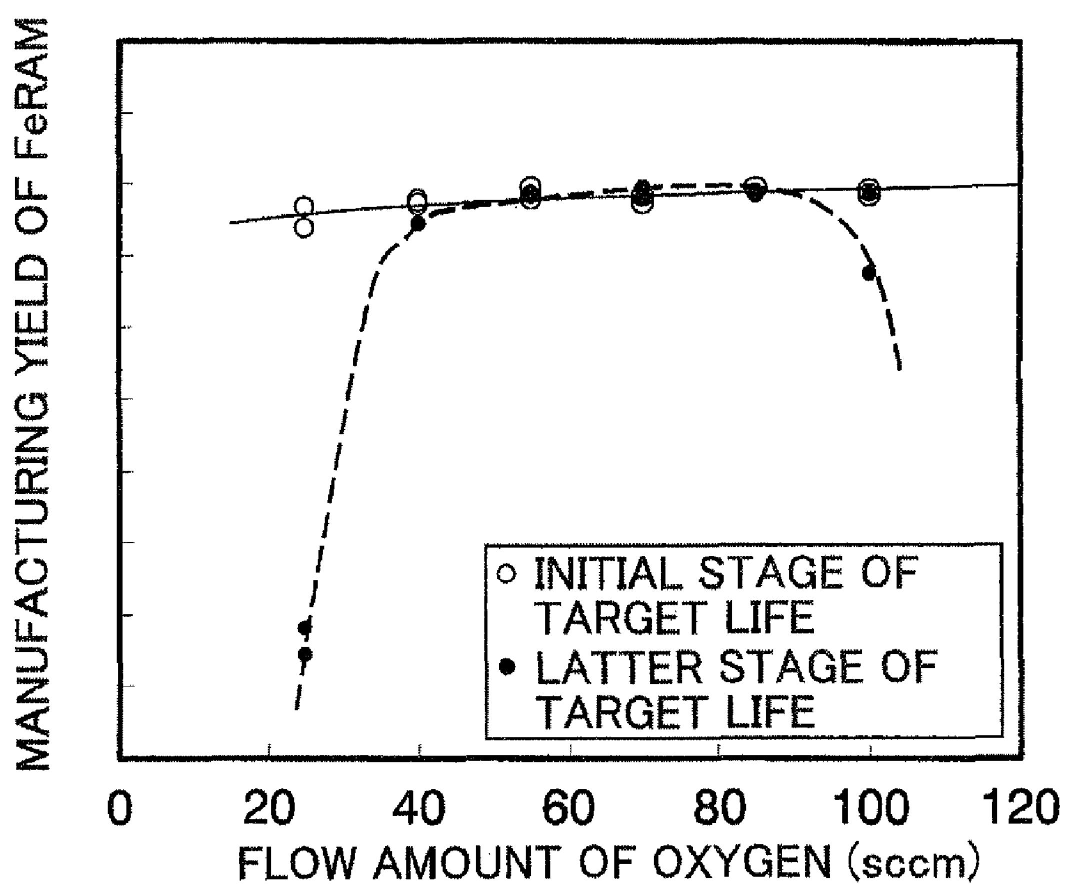
FIG. 5 shows the relationship between an oxygen feed amount at the thermal treatment after the fabrication of a PZT film and a fabrication yield of the FeRAM.

FIG. 5 shows the relationship between an oxygen feed amount during the thermal treatment after the fabrication of a PZT film and a fabrication yield of FeRAM. The abscissa represents an oxygen feed amount at the thermal treatment after the formation of a PZT film; and the ordinate represents a fabrication yield of FeRAM. In FIG. 5, a "○" mark represents a fabrication yield of FeRAM having a ferroelectric film formed in the initial stage of the lifetime of a PZT target; and a "●" mark represents a fabrication yield of FeRAM having a ferroelectric film formed in the latter stage of the lifetime of a PZT target. It is understood from FIG. 5 that in the ferroelectric film formed in the initial stage of the lifetime, when the oxygen feed amount during the thermal treatment (oxygen-feed annealing) is in the range of from 20 to 100 sccm, the fabrication yield of FeRAM is good; and that in the ferroelectric film formed in the latter stage of the lifetime, the fabrication yield of FeRAM is largely lowered unless the oxygen feed amount is in the range of from 40 to 100 sccm.

Judging synthetically from the foregoing, the thermal treatment is carried out with respect to a ferroelectric film fabricated in the initial stage of the lifetime of a target by setting up the oxygen feed amount at from 40 to 60 sccm; and the thermal treatment is carried out with respect to a PZT film fabricated in the latter stage by setting up the oxygen feed amount at from 70 to 100 sccm.

Figure 6:
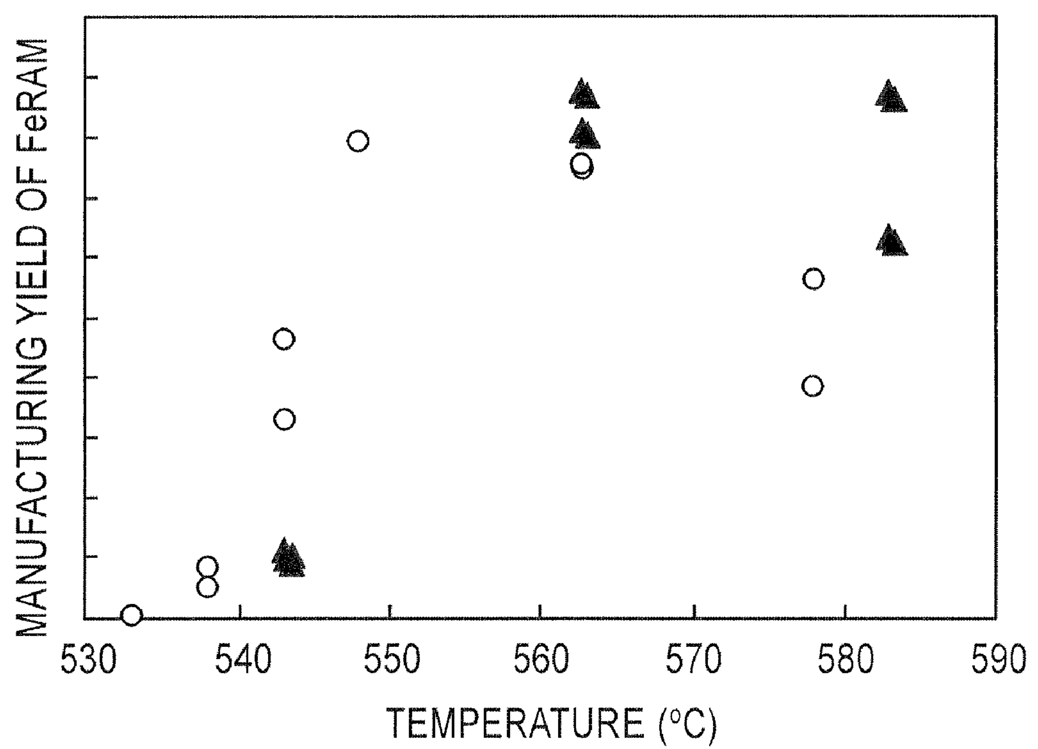
FIG. 6 shows the relationship between a temperature at the thermal treatment and a fabrication yield of the FeRAM.

FIG. 6 shows the relationship between a temperature during the thermal treatment which is carried out after the formation of a PZT film and a fabrication yield of FeRAM. The abscissa represents a temperature during the thermal treatment which is carried out after the formation of a PZT film; and the ordinate represents a fabrication yield of FeRAM. It is understood from FIG. 6 that when the temperature during the thermal treatment is from 545 to 565° C., the fabrication yield of FeRAM is good. Accordingly, the temperature of the thermal treatment (oxygen-feed annealing) which is carried out after the formation of a ferroelectric film is set up at from 545 to 565° C. in the first embodiment. By thus setting up the oxygen feed amount and the temperature during the thermal treatment (oxygen-feed annealing) after the formation of a ferroelectric film, it is possible to manufacture FeRAM with uniform characteristics in a good yield.

A method for manufacturing the semiconductor (FeRAM) according to a second embodiment is hereunder described.

FIGS. 7 to 10 are each a cross-sectional view to show a method for manufacturing a semiconductor of a second embodiment. Usually, an n-type transistor and a p-type transistor configuring a drive circuit (for example, a write circuit and a read circuit) are formed on a semiconductor substrate simultaneously with a memory cell. Here, illustration of these is, however, omitted.

Figure 7A:
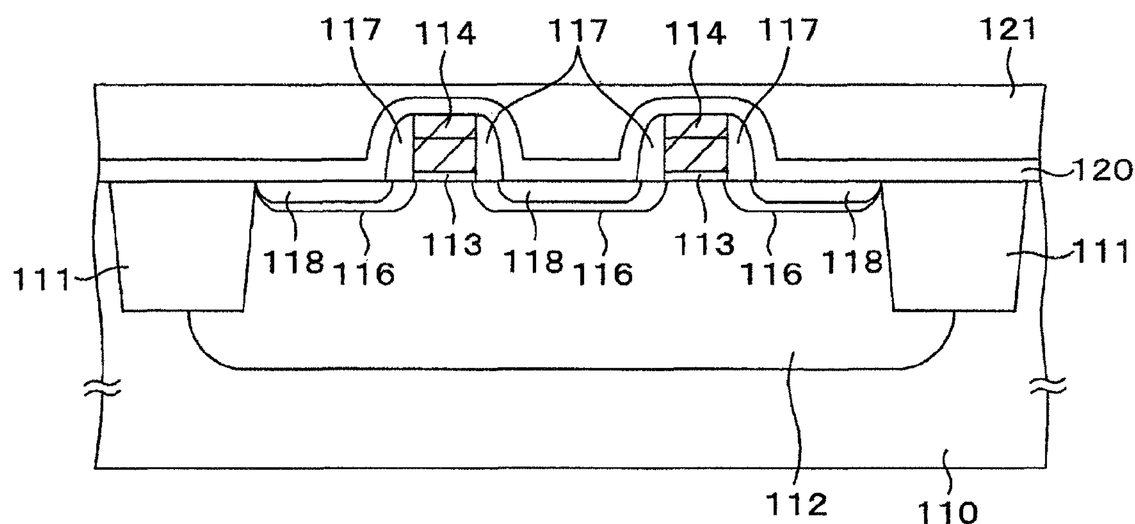
FIG. 7A shows a second embodiment of the present invention.

Steps until a structure as shown in FIG. 7A is formed are described. As shown in FIG. 7A, a device isolation layer 111 is formed in a prescribed region of a semiconductor substrate (silicon substrate) 110. Concretely, a trench is formed in a prescribed region of the semiconductor substrate 110 by a photolithography method. By embedding an insulating material such as $SiO_2$ in the trench, the device isolation layer 111 is formed. A method for forming the device isolation layer 111 by the trench having such an insulating material embedded therein is called an STI (shallow trench isolation) method. A device isolation layer may be formed by a LOCOS (local oxidation of silicon) method instead of the device isolation layer 111 by the STI method. The semiconductor substrate 110 may be any of a p-type or an n-type.

Next, by implanting p-type impurities (for example, boron (B)) into an n-type transistor forming region (a memory cell region and an n-type transistor forming region of a drive circuit; hereinafter the same) of the semiconductor substrate 110, a p-well 112 is formed. Furthermore, by implanting n-type impurities (for example, phosphorus (P)) into a p-type transistor forming region (a p-type transistor forming region of a drive circuit; hereinafter the same) of the semiconductor substrate 110, an n-well (not illustrated) is formed.

Next, a surface of each of the p-well 112 and the n-well (not illustrated) is thermally oxidized to form a gate dielectric film 113. Thereafter, a polysilicon film is formed over the entire surface on an upper side of the semiconductor substrate 110 by a CVD method. By patterning this polysilicon film by a photolithography method, a gate electrode 114 is formed.

It is preferable that a gate electrode having n-type impurities introduced thereinto is formed in an upper part of the p-well 112. It is also preferable that a gate electrode having p-type impurities introduced thereinto is formed in an upper part of the n-well (not illustrated). The two gate electrodes 114 are disposed parallel to each other on the single p-well 112 in the memory cell region as shown in FIG. 7A.

Next, by using the gate electrode 114 as a mask and ion injecting n-type impurities such as phosphorus (P) into the p-well 112 of the n-type transistor forming region, a low-concentration n-type impurity region 116 is formed. Similar to this, by using the gate electrode 114 as a mask and ion injecting p-type impurities such as boron (B) into the n-well (not illustrated) of the p-type transistor forming region, a low-concentration p-type impurity region (not illustrated) is formed.

Next, a side wall 117 is formed on both sides of the gate electrode 114. This wide wall 117 is formed by forming a dielectric film made of $SiO_2$ or SiN or the like over the entire surface on an upper side of the silicon substrate 110 by a CVD method and then etch-backing this dielectric film to leave it only on the both sides of the gate electrode 114.

Thereafter, by using the gate electrode 114 and the side wall 117 as a mask and ion injecting n-type impurities into the p-well 112 of the n-type transistor forming region, a high-concentration n-type impurity region 118 is formed. Similar to this, by using the gate electrode and the side wall in the p-type transistor forming region as a mask and ion injecting p-type impurities into the n-well (not illustrated), a high-concentration p-type impurity region (not illustrated) is formed. A transistor having source/drain of an LDD (lightly doped drain) structure is thus formed in each transistor forming region.

It is preferable that a metal silicide layer, for example, cobalt silicide and titanium silicide is formed as a contact layer on a surface of each of the gate electrode 114 and the n-type impurity region 118.

Next, for example, a SiON film is formed in a thickness of 200 nm as a stopper layer 120 over the entire surface on an upper side of the silicon substrate 110 by a CVD method. Furthermore, for example, a $SiO_2$ film is formed in a thickness of 1,000 nm as an interlayer dielectric film 121 on the stopper layer 120. Thereafter, a surface of the interlayer dielectric film 121 is flattened by CMP.

Figure 7B:
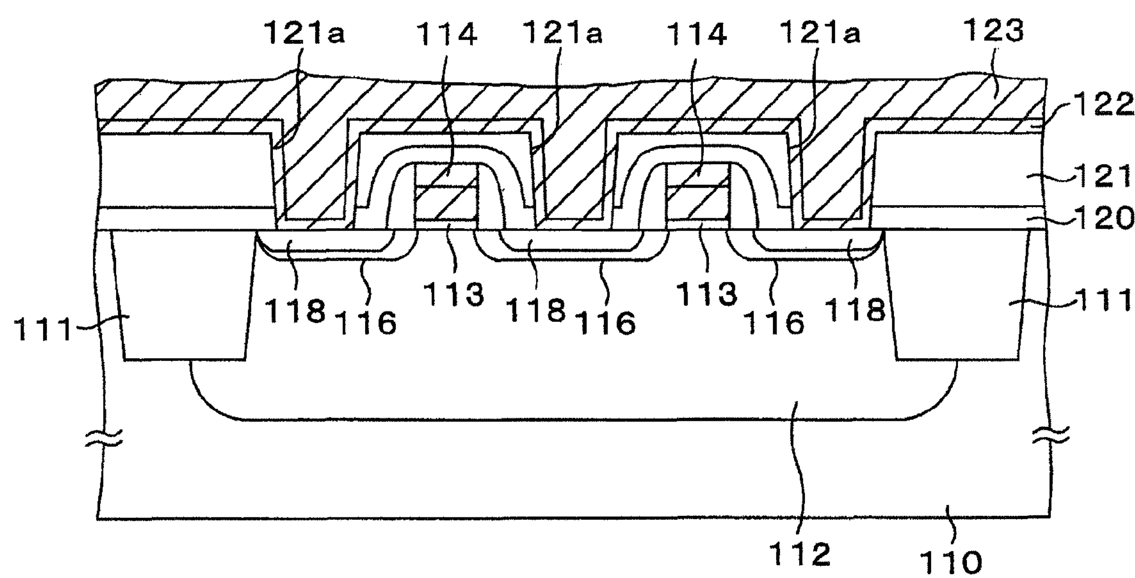
FIG. 7B shows the second embodiment of the present invention.

Steps until a structure as shown in FIG. 7B is formed are described. After flattening the surface of the interlayer dielectric film 121, contact holes 121*a* each extending from the surface of the interlayer dielectric film 121 to the high-concentration n-type impurity region 118 of the n-type transistor forming region and the high-concentration p-type impurity region (not illustrated) of the p-type transistor forming region are formed by a photolithography method. Thereafter, an annealing treatment is carried out as a degassing treatment at a temperature of 650° C. for 30 minutes in a nitrogen ($N_2$) atmosphere.

Next, an adhesive layer 122 is formed over the entire surface on an upper side of the semiconductor substrate 110. This adhesive layer 122 is required to have not only a function to enhance adhesion between the interlayer dielectric film 121 and plugs 124*a* and 124*b* but a function to prevent diffusion of hydrogen and moisture contained in the interlayer dielectric film 121 into a ferroelectric film 127. In the second embodiment, the adhesive layer 122 is composed of a stack film of Ta (20 nm)/TaN (50 nm)/Ti (20 nm). It is preferable that the adhesive layer 122 is a conductive film made of TiAlN, Ir, $IrO_x$, Pt, Ru, Ti, Ta, TaN or TiN or the like, or is formed by stacking two or more films selected among these conductive films. A thickness of the adhesive layer 122 is preferably not more than 100 nm.

Next, a W (tungsten) film 123 having a thickness of about 500 nm is formed on the adhesive layer 122 and embedded in the contact holes 121*a*.

Figure 8A:
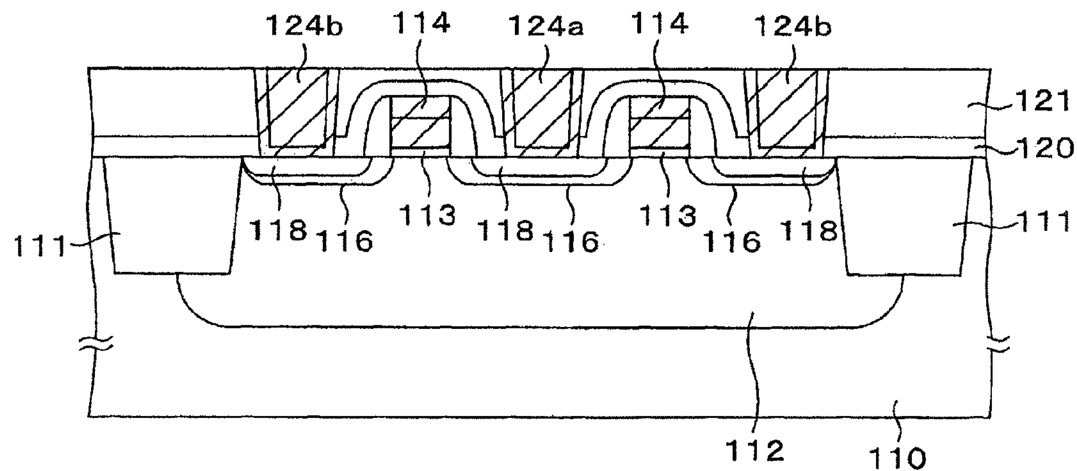
FIG. 8A shows the second embodiment of the present invention.

Steps until a structure as shown in FIG. 8A is formed are described. After forming the W film 123, the W film 123 and the adhesive layer 122 on the interlayer dielectric film 121 are removed by CMP, and the surface is flattened. The W film 123 thus remains only within each of the contact holes 121*a*, and the conductive plugs 124*a* and 124*b* are formed.

Figure 8B:
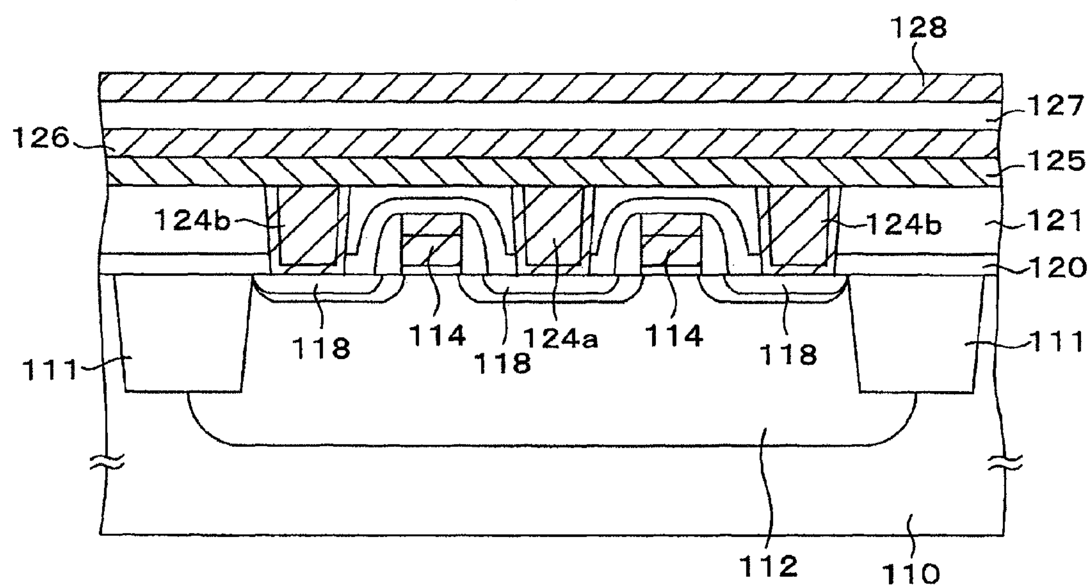
FIG. 8B shows the second embodiment of the present invention.

Steps until a structure as shown in FIG. 8B is formed are hereunder described. After forming the W plugs 124*a* and 124*b*, a barrier metal (oxygen barrier layer) 125 is formed in a thickness of, for example, from 100 to 200 nm over the entire surface on an upper side of the semiconductor substrate 110 by a sputtering method. This barrier metal 125 is formed of a noble metal such as Ir and Ru or TiAlN or the like.

The barrier metal 125 is formed in order to prevent diffusion of oxygen into the plugs 124*a* and 124*b* in a fabrication step of a ferroelectric film 127 or a subsequent thermal treatment step as described later. A conductive adhesive layer (not illustrated) made of Ti (titanium), TiN, TiAlN, Ir (iridium), Pt (platinum), Ru (ruthenium), Ta (tantalum), or the like may be provided between the interlayer dielectric film 121 and the barrier metal 125. A conductive adhesive layer (not illustrated) may be provided in order to enhance adhesion between the barrier metal 125 and the interlayer dielectric film 121 and enhance crystallinity of the barrier metal 125. The thickness of this conductive adhesive layer is preferably not more than 30 nm.

Next, a conductive film 126 which will be a lower electrode 126*a* of a ferroelectric capacitor 130 is formed on the barrier metal 125. This conductive film 126 is formed of at least one conductive material selected from the group consisting of metals, for example, Pt, Ir, Ru, Rh, Re, Os and Pd, oxides of such a metal, and $SrRuO_3$.

Next, a ferroelectric film (PZT film) 127 is formed in a thickness of, for example, 120 nm on the conductive film 126 by a sputtering method using a PZT target. In the second embodiment, a flow rate of Ar (chamber pressure) is adjusted in accordance with the period for using the PZT target. At that time, it is important to record the relationship between a lot for a wafer type and the period of the use of the PZT target.

Next, an RTA (rapid thermal annealing) (oxygen-feed annealing) treatment is carried out in an oxygen-containing atmosphere.

Figure 11:
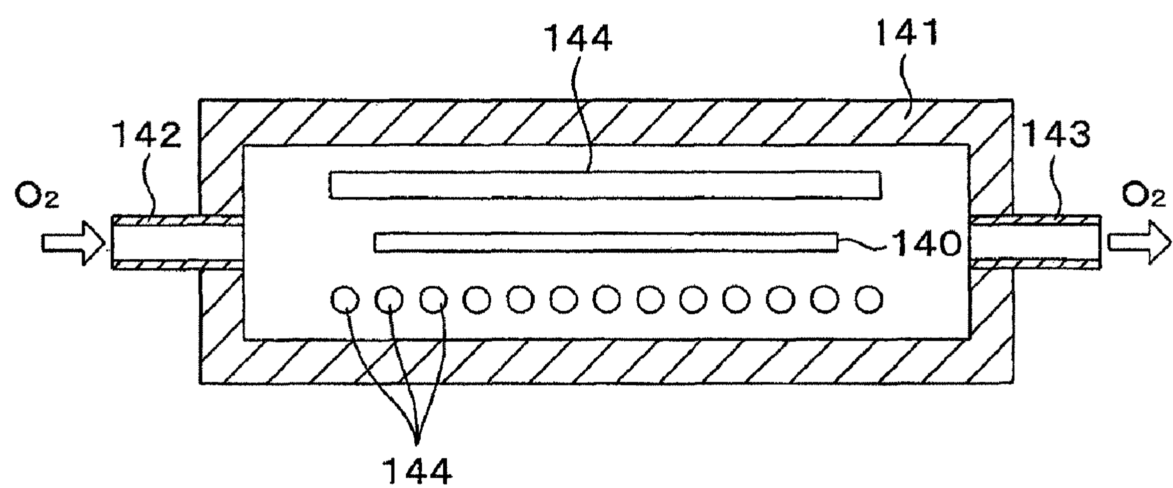
FIG. 11 shows an RTA system which is used for oxygen-feed annealing.

FIG. 11 shows a cross-sectional view to show an RTA system. After forming the ferroelectric film, a wafer 140 is disposed within a chamber 141 of the RTA system as shown in FIG. 11. An oxygen-containing gas (for example, an oxygen gas and a mixed gas of oxygen and argon) is fed into the chamber 141 from a gas introduction port 142. The gas fed into the chamber 141 is discharged to the outside of the chamber 141 from a gas discharge port 143 on an opposite side to the gas introduction port 142.

Plural infrared lamps 144 are provided above and below the wafer 140, respectively. By lighting these infrared lamps 144, the wafer 140 can be rapidly heated.

In the second embodiment, the thermal treatment is carried out at a wafer temperature of from 545° C. to 565° C. for from about 60 seconds to 90 seconds. In this case, an oxygen feed amount into the chamber 141 is adjusted in accordance with the period of use (the accumulated period of use) of the PZT target during the sputtering. Here, when the PZT film fabricated in the first half of the lifetime of the PZT target is thermally treated as described previously, the oxygen feed amount into the chamber 141 is set up at from 40 to 60 sccm. When the PZT film fabricated in the second half of the lifetime is thermally treated, the oxygen feed amount into the chamber 141 is set up at from 70 to 100 sccm.

After thus carrying out the RTA (oxygen-feed annealing) treatment of the ferroelectric film 127, a conductive film 128 which will be an upper electrode 128*a* of the ferroelectric capacitor 130 is formed in a thickness of, for example, 200 nm on the ferroelectric film 127. In the second embodiment, the conductive film 128 is formed of $IrO_2$. This conductive film 128 may be formed of a metal film of at least one member selected from the group consisting of Pt (platinum), Ir (iridium), Ru (ruthenium), Rh (rhodium), Re (rhenium), Os (osmium), Pd (palladium) and $SrRuO_3$ or an oxide film of such a metal or by stacking two or more films thereof.

Figure 9A:
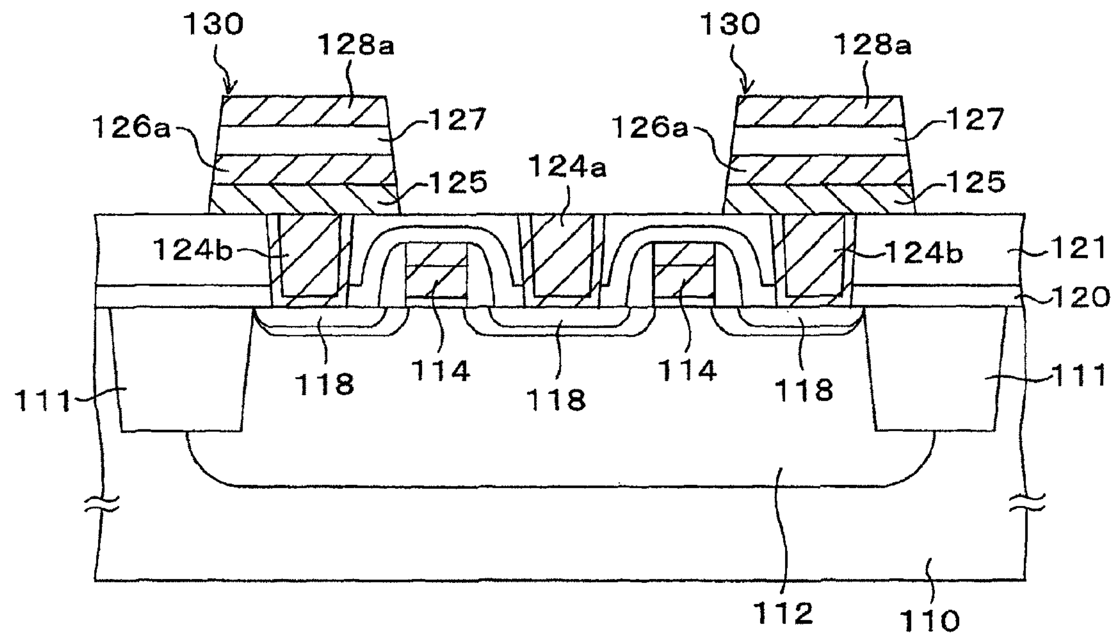
FIG. 9A shows the second embodiment of the present invention.

Steps until a structure as shown in FIG. 9A is formed are described. After forming the barrier metal 125, the conductive film 126, the ferroelectric film 127 and the conductive film 128, a hard mask (not illustrated) having, for example, a stack structure of a TiN film and an $SiO_2$ film is formed in a prescribed region (ferroelectric capacitor forming region) of the conductive film 128. Thereafter, the conductive film 128, the ferroelectric film 127, the conductive film 126 and the barrier metal 125 are batch etched. The ferroelectric capacitor 130 composed of the lower electrode 126*a*, the upper electrode 128*a* and the ferroelectric film 127 therebetween is thus formed as shown in FIG. 9A. Thereafter, the hard mask is removed.

Figure 9B:
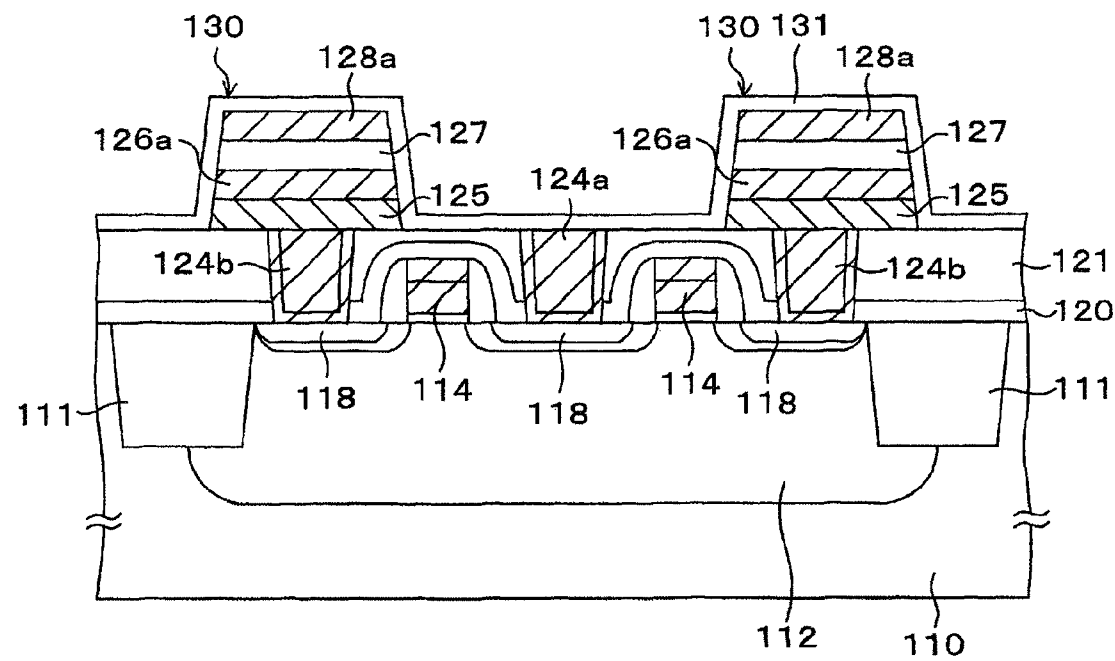
FIG. 9B shows the second embodiment of the present invention.

Steps until a structure as shown in FIG. 9B is formed are hereunder described. After forming the ferroelectric capacitor 130 by etching the conductive film 128, the ferroelectric film 127, the conductive film 126 and the barrier metal 125, the ferroelectric capacitor 130 is annealed in an oxygen-containing atmosphere at a temperature of 350° C. for one hour. This annealing is carried out in order to ensure adhesion of a passivation film 131 which is formed in a next step.

Next, a passivation film 131 for covering the ferroelectric capacitor 130 is formed in a thickness of, for example, from 20 to 100 nm on the interlayer dielectric film 121. This passivation film 131 is made of, for example, $Al_2O_3$ (alumina) and is formed by an MOCVD method or a sputtering method.

Next, in order to recover damages of the ferroelectric film 127 in the etching step and the upper electrode forming step, recovery annealing is carried out. This recovery annealing is carried out by heating in an oxygen-containing atmosphere, for example, at a temperature of from 550 to 650° C. for about 60 minutes.

Figure 10:
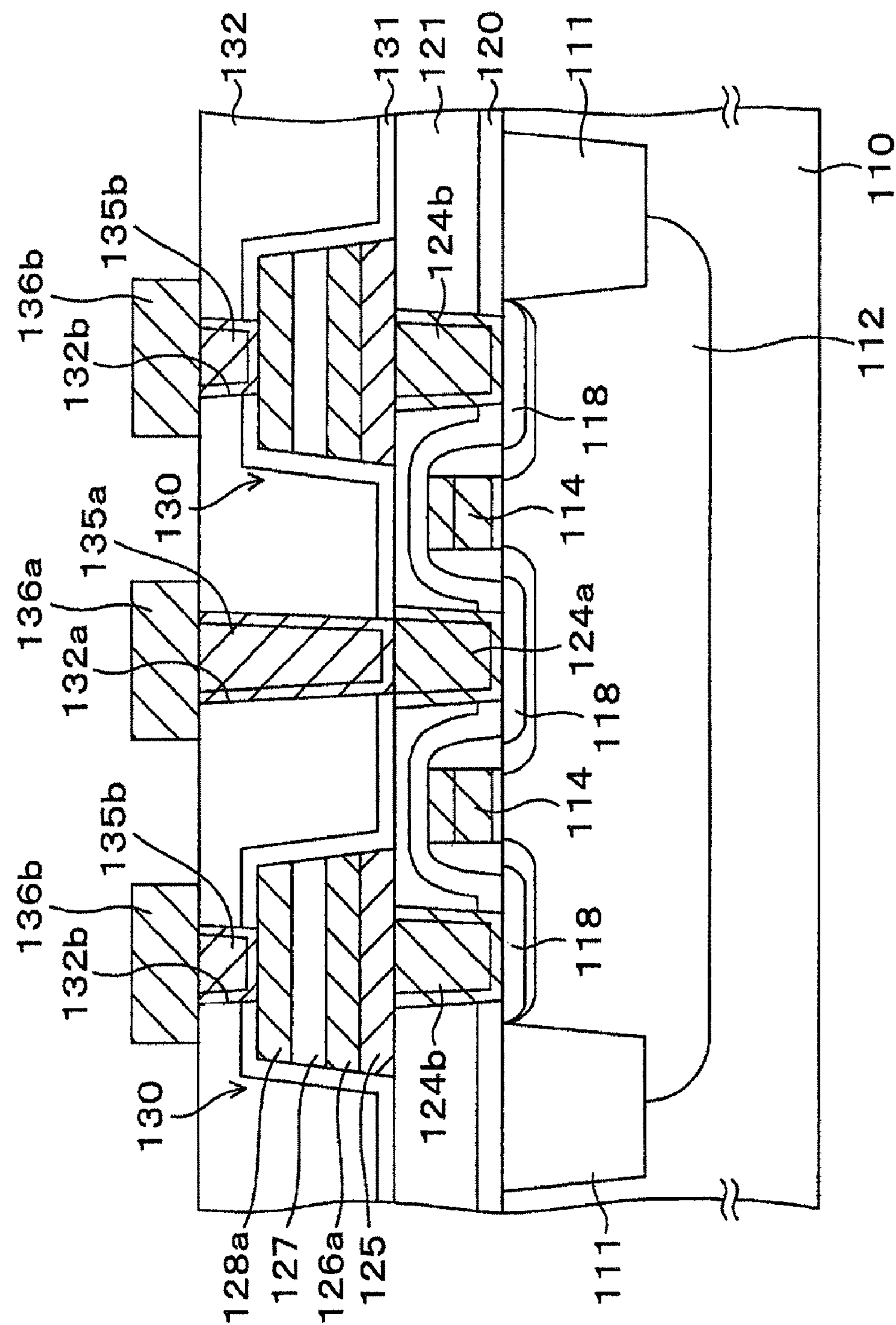
FIG. 10 shows the second embodiment of the present invention.

Steps until a structure as shown in FIG. 10 is formed are hereunder described. After carrying out the recovery annealing, an interlayer dielectric film 132 made of, for example, $SiO_2$ is formed over the entire surface on an upper side of the semiconductor substrate 110 by a plasma CVD method. Then, a contact hole 132*a* extending from a surface of the interlayer dielectric film 132 to the prescribed plug 124*a* and a contact hole 132*b* extending from a surface of the interlayer dielectric film 132 to the upper electrode 128*a* of the ferroelectric capacitor 130 are formed by a photolithography method.

Next, an adhesive layer made of TiN is formed in a thickness of, for example, 50 nm over the entire surface on an upper side of the substrate 110. This adhesive layer covers an inner surface of each of the contact holes 132*a* and 132*b*. Thereafter, a W (tungsten) film is formed on the adhesive layer by a CVD method, and the contact holes 132*a* and 132*b* are filled with W. Then, the W film and the adhesive layer on the interlayer dielectric film 132 are removed by CMP. By leaving W only in the inside of each of the contact holes 132*a* and 132*b* by this removal, conductive plugs 135*a* and 135*b* are formed.

Next, a stack film of Ti (60 nm), TiN (30 nm), an Al film (400 nm), Ti (5 nm) and TiN (70 nm) is formed on the interlayer dielectric film 132. This stack film is subjected to patterning by a photolithography method, thereby forming wirings 136*a* and 136*b*. Thereafter, an interlayer dielectric film and an upper layer wiring are formed as the need arises. A semiconductor device (FeRAM) with a stack structure having the ferroelectric capacitor 130 stacked on the plug 124*b* is thus accomplished.

According to the second embodiment, in the thermal treatment (oxygen-feed annealing) step which is carried out after the formation of a dielectric film, the oxygen feed amount into the atmosphere is changed in accordance with the accumulated period of use of the target. For example, in the second embodiment, the thermal treatment is carried out such that the oxygen feed amount is relatively low with respect to a ferroelectric film fabricated in the initial stage of the lifetime of a target, whereas the oxygen feed amount relatively high with respect to a ferroelectric film fabricated in the latter stage of the lifetime of a target. A deficiency of the oxygen concentration in the ferroelectric film is thus dissolved. Thus, scattering in the polarization reversal characteristic is suppressed. As a result, it is possible to manufacture a semiconductor device provided with a ferroelectric capacitor having a good and uniform polarization reversal characteristic, namely a semiconductor device having uniform characteristics, thereby resulting a good yield.

The second embodiment also has an advantage that the manufacturing costs can be reduced because the target which is used for the manufacture of the ferroelectric film 127 can be effectively utilized to the last of the lifetime.

In the second embodiment, an example of application to the manufacture of a semiconductor device (e.g., FeRAM) having a stack structure has been described. However, the second embodiment is also applicable to a semiconductor (e.g., FeRAM) having a planar structure similarly as described herein.

Example embodiments of the present invention have now been described in accordance with the above advantages. It will be appreciated that these examples are merely illustrative of the invention. Many variations and modifications will be apparent to those skilled in the art.

What is claimed is:

1. A method for manufacturing a semiconductor device comprising:

forming a lower electrode on a semiconductor substrate, sputtering a ferroelectric film on the lower electrode using a target, thermal treating the ferroelectric film in an atmosphere containing oxygen in accordance with an accumulated period of use of the target for fabricating the ferroelectric film, and forming an upper electrode on the ferroelectric film, wherein the ferroelectric film is thermal treated in an atmosphere having a first amount of oxygen when using an amount of target material corresponding to a first sputtering rate of the ferroelectric film, and the ferroelectric film is thermal treated in an atmosphere having a second amount of oxygen when using an amount of target material corresponding to a second sputtering rate of the ferroelectric film, the second amount of oxygen being larger than the first amount of oxygen and the second sputtering rate being larger than the first sputtering rate.

2. The method for manufacturing the semiconductor device according to claim 1, wherein the oxygen amount of thermal treating is changed from 40 sccm to 100 sccm in accordance with the accumulated period.

3. The method for manufacturing a semiconductor device according to claim 1, including providing a flow of argon when fabricating the ferroelectric film, wherein the flow of the argon has a flow rate, wherein the accumulated period is variable and wherein the flow rate of the argon varies with the variable accumulated period.

4. The method for manufacturing the semiconductor device according to claim 1, wherein the ferroelectric film fabricated in a latter stage of a lifetime of the target material, which includes the time when using the amount of the target material corresponding to the second sputtering rate, is thermal treated in an atmosphere having a larger amount of oxygen than the amount of oxygen for fabricating the ferroelectric film in the initial stage of the lifetime of the target material, which includes the time when using the amount of the target material corresponding to the first sputtering rate.

5. The method for manufacturing the semiconductor device according to claim 1, wherein the ferroelectric film is formed of PZT.

6. The method for manufacturing the semiconductor device according to claim 1, wherein a temperature of the thermal treating is set from 545° C. to 565° C.

7. The method for manufacturing the semiconductor device according to claim 2, wherein the thermal treating comprises RTA (rapid thermal annealing).

8. A method for manufacturing a semiconductor device comprising:

forming a gate dielectric film on a semiconductor substrate, forming a gate electrode on the gate dielectric film, using the gate electrode as a mask and introducing impurities into the semiconductor substrate to form an impurity region, forming a dielectric film over the entire surface on an upper side of the semiconductor substrate, forming contact hole extending to the impurity region in the dielectric film, embedding a conductive body within the contact hole to form a plug electrically connected to the impurity region, forming a lower electrode electrically connected to the plug on the dielectric film, forming a ferroelectric film on the lower electrode by sputtering using a target, thermal treating the ferroelectric film in an oxygen environment in accordance with an accumulated period of use of the target when fabricating the ferroelectric film, and forming an upper electrode on the ferroelectric film, wherein the ferroelectric film is thermal treated in an atmosphere having a first amount of oxygen when using an amount of target material corresponding to a first sputtering rate of the ferroelectric film, and the ferroelectric film is thermal treated in an atmosphere having a second amount of oxygen when using an amount of target material corresponding to a second sputtering rate of the ferroelectric film, the second amount of oxygen being larger than the first amount of oxygen and the second sputtering rate being larger than the first sputtering rate.

9. The method for manufacturing the semiconductor device according to claim 8, wherein the oxygen environment has an oxygen amount and wherein the oxygen amount used in thermal treating varies from 40 sccm to 100 sccm in accordance with the accumulated period.

10. The method for manufacturing the semiconductor device according to claim 8, wherein the thermal treating is RTA (rapid thermal annealing).

11. The method for manufacturing the semiconductor device according to claim 8, wherein a temperature of the thermal treating is set from 545° C. to 565° C.

12. The method for manufacturing the semiconductor device according to claim 8, wherein during the first half of the lifetime of the target material, which includes the time when using the amount of the target material corresponding to the first sputtering rate, the oxygen amount is set from 40 sccm to 60 sccm, and during the second half of the lifetime of the target material, which includes the time when using the amount of the target material corresponding to the second sputtering rate, the oxygen amount is set from 70 sccm to 100 sccm.

* * * * *